(12) United States Patent
Maloney

(10) Patent No.: US 7,817,400 B2
(45) Date of Patent: Oct. 19, 2010

(54) RELAY ACTUATOR CIRCUIT AND METHOD

(75) Inventor: Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 1182 days.

(21) Appl. No.: 11/415,802

(22) Filed: May 1, 2006

(65) Prior Publication Data

US 2007/0253137 A1 Nov. 1, 2007

(51) Int. Cl.
    *H01H 47/24* (2006.01)
(52) U.S. Cl. .................................................. 361/173
(58) Field of Classification Search .............. 361/155, 361/173
    See application file for complete search history.

(56) References Cited

U.S. PATENT DOCUMENTS 4,360,853 A * 11/1982 Welk ........................... 361/115
5,699,218 A * 12/1997 Kadah .......................... 361/13
7,095,267 B2 * 8/2006 Sato ............................ 327/514
2005/0280403 A1 * 12/2005 Sato ............................ 323/282
2006/0238946 A1 * 10/2006 Schreckenberger ......... 361/100

OTHER PUBLICATIONS

Maloney et al., "Transmission Line Pulsing Techniques for Circuit Modeling of ESD Phenomena," EOS/ESD Symposium, Sep. 1985, pp. 49-54.
Young, The New Penguin Dictionary of Electronics, 1979, pp. 440-443 (definition of "relay").

* cited by examiner

*Primary Examiner*—Ronald W Leja
(74) *Attorney, Agent, or Firm*—Schwabe, Williamson & Wyatt, P.C.

(57) ABSTRACT

In some embodiments, an apparatus includes a power supply to generate a supply current; at least one optoisolator coupled to the power supply and responsive to the supply current to generate a charging current; a capacitor, coupled to the at least one optoisolator, to build up a charge in response to the charging current; and an actuating switch, coupled to the capacitor, to release the charge from the capacitor to generate a relay actuating current.

20 Claims, 4 Drawing Sheets

RELAY ACTUATOR CIRCUIT AND METHOD

BACKGROUND

1. Technical Field

Embodiments of the present invention are related to the field of electronic devices, and in particular, to electromagnetic relays.

2. Description of Related Art

An electromagnetic relay may include a relay switch and a relay coil for opening and closing the relay switch when a relay actuating current flows through the relay coil. In some designs, a low voltage or current through the relay coil (low voltage side) may be used to switch the relay switch, which in turn switches a much higher voltage or current (high-voltage side), with the transition between the low voltage side and the high-voltage side being referred to as a high-voltage barrier or interface. A breakdown voltage of the relay may at times be determined by the voltage from the high-voltage side of the relay switch to the relay coil, rather than the voltage from the high side of the relay switch to the low side of the relay switch.

In other designs, the relay coil may be placed on the high-voltage side of a high-voltage barrier. In such a case, the relay may operate to higher voltage if the relay coil is allowed to float so that the relay actuating signal to the relay coil is not referred to earth ground.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
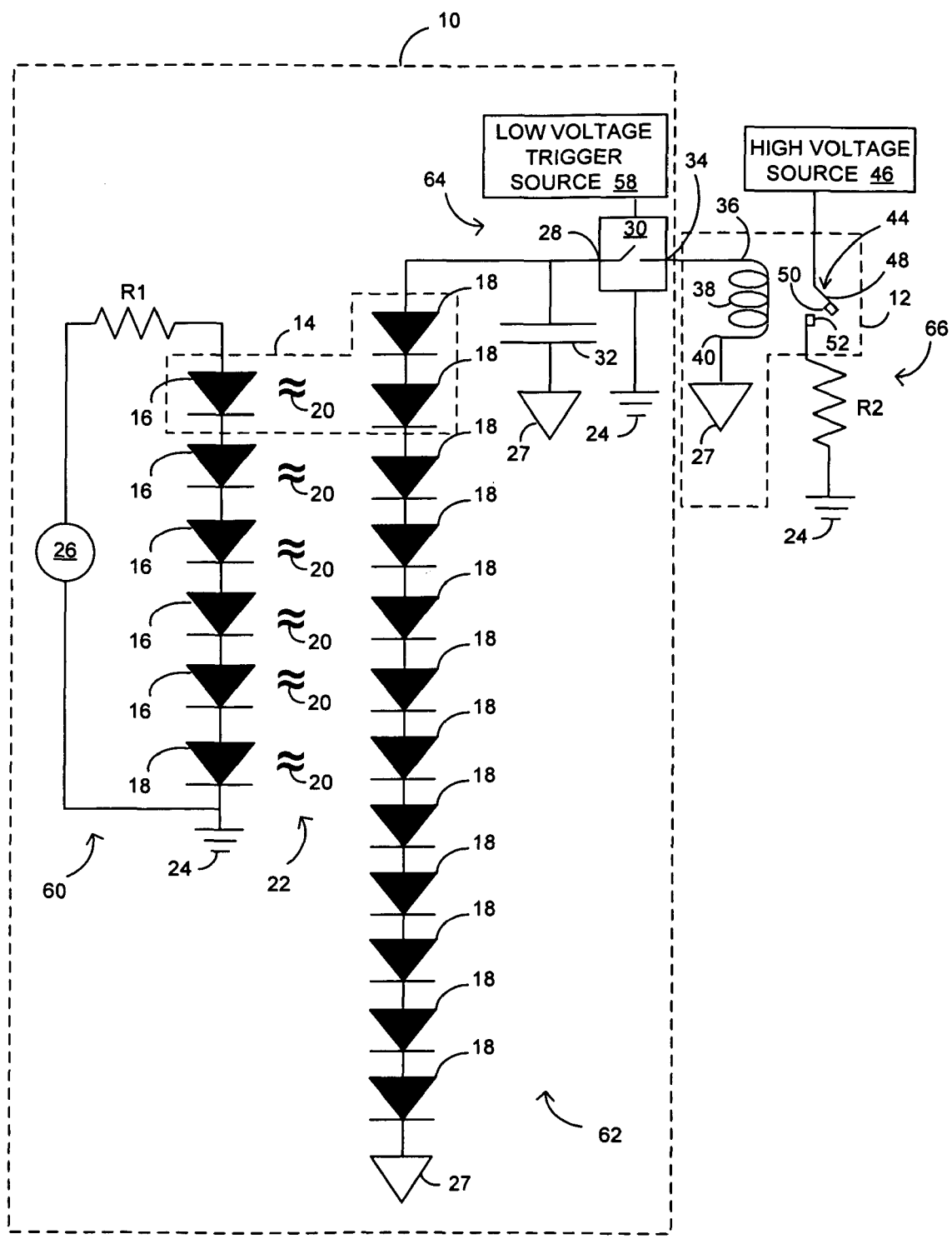
FIG. 1 is a circuit schematic of a relay actuator circuit and an electromagnetic relay, according to some embodiments of the present invention.

With reference to FIG. 1, there is illustrated a relay actuator circuit 10 for an electromagnetic relay 12, according to some embodiments of the present invention. In some embodiments, the relay actuator circuit 10 may be optically isolated and optically powered, as will be described hereinafter. The relay actuator circuit 10 may include a plurality of optoisolators 14, with each optoisolator 14 including at least one light-emitting diode (LED) 16 and at least one photodiode 18 optically coupled (illustrated by symbols 20) to the LED 16 with a transparent gap 22 therebetween. The optoisolators 14 also may be referred to as optocouplers or photocouplers. The values and part selections to be described hereinafter are merely illustrated of one of many possible implementations for the relay actuator circuit 10.

Figure 2:
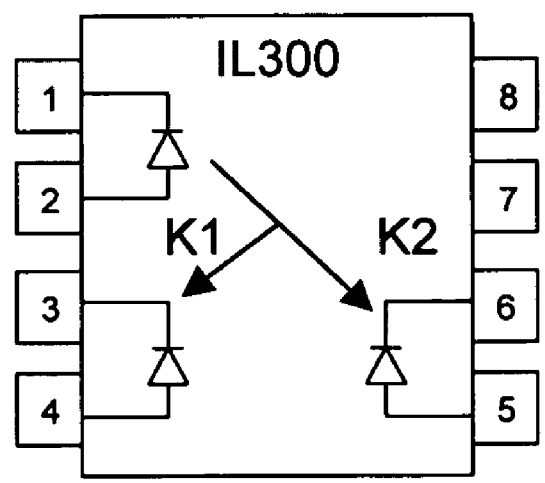
FIG. 2 is a circuit schematic of an optoisolator shown in FIG. 1, according to various embodiments.

On one side of the gaps 22, the LEDs 16 of the optoisolators 14 may be coupled in series to an earth ground 24 (low-voltage ground). A low-voltage direct current (DC) power supply 26 and a load resistance R1 may be coupled across the series-coupled LEDs 16. In some embodiments, there may be set of six optoisolators 14, with each optoisolator 14 including one LED 16 and two photodiodes 18. Referring to FIGS. 1 and 2, an example of such an optoisolators 14 may be identified by a Siemens' part number IL300 optoisolator, as shown in FIG. 2, which feature two photodiodes 18 per unit, and thus may generate about one volt of output voltage, optically isolated from the LEDs 16. In some embodiments, an example of the DC voltage of the power supply 26 may be 10 volts.

Referring to FIG. 1, on the other side of the gaps 22, the photodiodes 18 of the optoisolators 14 may be coupled in series between a floating ground 27 (high-voltage ground) and a terminal 28 of an optically-isolated, actuating switch 30. A capacitor 32 may be coupled in parallel with the series-coupled photodiodes 18 between the terminal 28 of the actuating switch 30 and the floating ground 27. In some embodiments, an example of the size of the capacitor 32 may be 47 uF. In some embodiments, wherein the optoisolators 14 are IL300 optoisolators, the optoisolators 14 may have enough charging current transfer efficiency (K1 and K2 are about 0.007 while forward LED current can be up to 60 mA) to allow hundreds of microamps of output, filling the capacitor 32 (e.g., 47 uF) in a couple of seconds.

The relay actuator circuit 10, according to some embodiments of the present invention, is coupled to the electromagnetic relay 12 to actuate the electromagnetic relay 12. More specifically, a terminal 34 of the actuating switch 30 may be coupled to a terminal 36 of a relay coil 38 of the electromagnetic relay 12, with a terminal 40 of the relay coil 38 being coupled to the floating ground 27. The electromagnetic relay 12 also includes a relay switch 44 coupled between a high-voltage source 46 and the earth ground 24. In some embodiments, the relay switch 44 may include an armature 48 with a movable contact 50 which may engage a stationary contact 52, when in a close state. The contacts 50 and 52 may be spaced apart when in an open state. When closed, the high-voltage source 46 is coupled through the relay switch 44 and a load resistance R2 to the earth ground 24. The load resistance R2 to which the relay 12 is coupled may vary, depending upon the application in which the relay 12 is used. In some embodiments, the relay 12 may a mercury-wetted mechanical relay, with one example being identified by an Aleph's part number ZH1A05NZ. In some embodiments, the relay coil 38 may include an iron core.

Figure 3:
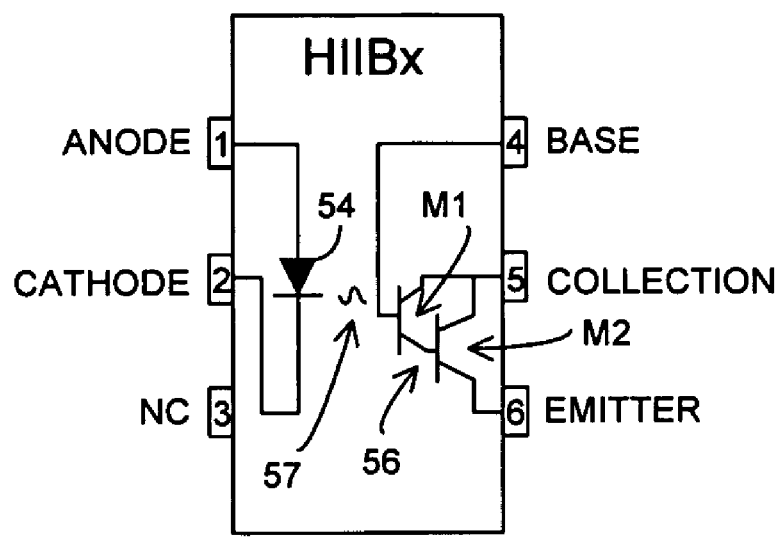
FIG. 3 is a circuit schematic of a photodarlington optoisolator shown in FIG. 1, according to various embodiments.

Referring to FIGS. 1 and 3, in some embodiments, the actuating switch 30 may be a photodarlington optoisolator that allows for the dumping of the charge of the capacitor 32 into the relay coil 38 as a relay actuating current. As illustrated in FIG. 3, the actuating switch 30 may include a LED 54 and an input phototransistor amplifier 56 (two bipolar transistors M1 and M2). The LED 54 and amplifier 56 may be separated by a transparent gap 57, with the amplifier 56 being optically coupled to the LED 54. In some embodiments, an example of a photodarlington optoisolator used for the actuating switch 30 may be identified by a Fairchild Semiconductor's part number H11Bx series, where x is 1, 2, 3, or 255, which is set to drive the needed relay actuating current. The H11Bx actuating switch 30 is illustrated with five pins, with pin 1 (anode) and pin 2 (cathode) being for the LED 54. Pin 4 (emitter), pin 5 (collector) and pin 6 (base, not used) are for the phototransistor amplifier 56. Pins 4 and 5 of the actuating switch 30 shown in FIG. 1 may be the terminals 28 and 34 in FIG. 1 and pins 1 and 2 of FIG. 3 may be coupled to a low-voltage trigger pulse source 58 and the earth ground 24, as shown in FIG. 1.

The power supply 26, the LEDs 16, the load resistance R1, and the earth ground 24 may define a power low-voltage circuit portion 60 (low-voltage loop) of the relay actuator circuit 10. The series-coupled photodiodes 18, the capacitor 32, the transistor amplifier 56, and the floating ground 27 may define a power/triggering high-voltage portion 62 of the relay actuator circuit 10. The low-voltage trigger pulse source 58, the LED 54, and the earth ground 24 may define a triggering low-voltage circuit portion 64 of the relay actuator circuit 10. The high-voltage source 46, the relay switch 44, and the earth ground 24 may define a relay switch high-voltage circuit 66.

The voltage of the power/triggering high-voltage circuit portion 62 is high relative to the low voltage of the power and triggering low-voltage circuit portions 60 and 64, with the two low-voltage circuit portions 60 and 64 being separated by the gaps 22 and 57, respectively, from the high-voltage circuit 62. When viewed from the perspective of the circuit portions 60 and 64, the gaps 22 and 57 may be described as defining a high-voltage barrier or interface. The relay coil 38 is on the high-voltage side of this high-voltage barrier. Hence, the relay actuator circuit 10 needs to power the high-voltage circuit portion 62 from the power low-voltage circuit portion 60 on the low-voltage side and trigger the high-voltage circuit portion 62 from the triggering low-voltage circuit portion 64 by transferring the needed energy across the high-voltage barrier. More specifically, the energy for power and triggering may be accomplished by transferring energy across the gaps 22 and 57, respectively, by the previously-described optical couplings. Hence, the relay actuator circuit 10 may not only provide for optical isolation of a relay-actuating signal generated by high-voltage circuit 62, it may also have an optically-powered supply of energy for the relay actuation of the high-voltage circuit 62.

The breakdown voltage of the relay 12 may at times be determined by the voltage from the high-voltage side of the relay 12 (side coupled to high-voltage source 46) to the relay coil 38, rather than the voltage from the high side of the relay switch 44 to the low side of the relay switch 44. By allowing the relay coil 38 to float (not coupled to the earth ground 24, but to the floating ground 27), the entire relay 12 may operate to a higher voltage. More specifically, the relay coil 38 is floated to high voltage, allowing the relay switch high-voltage circuit 66 to operate at a higher voltage. By allowing the relay coil 38 to float to high voltage, the possibility of a breakdown between the relay coil 38 and the high-voltage side of the relay switch 44 is reduced. Hence, the entire relay 12 may operate to the higher voltage, since the relay coil 38 is allowed to float.

Referring to FIG. 1 and a flow chart of FIG. 4, the operation of the relay actuator circuit 10 of FIG. 1, according to some embodiments of the present invention, will now be described in detail. In an operation 70 of FIG. 4, the power supply 26 may generate a direct current through the LEDs 16 and the load resistance R1 to the earth ground 24. This direct current may be referred to as a supply current, in that it causes the LEDs 16 to generate light. In one embodiment, the supply current may be about 20-30 mA. In an operation 72 of FIG. 4, light may be emitted from the LEDS 16 by passing the supply current through the LEDs 16.

Figure 4:
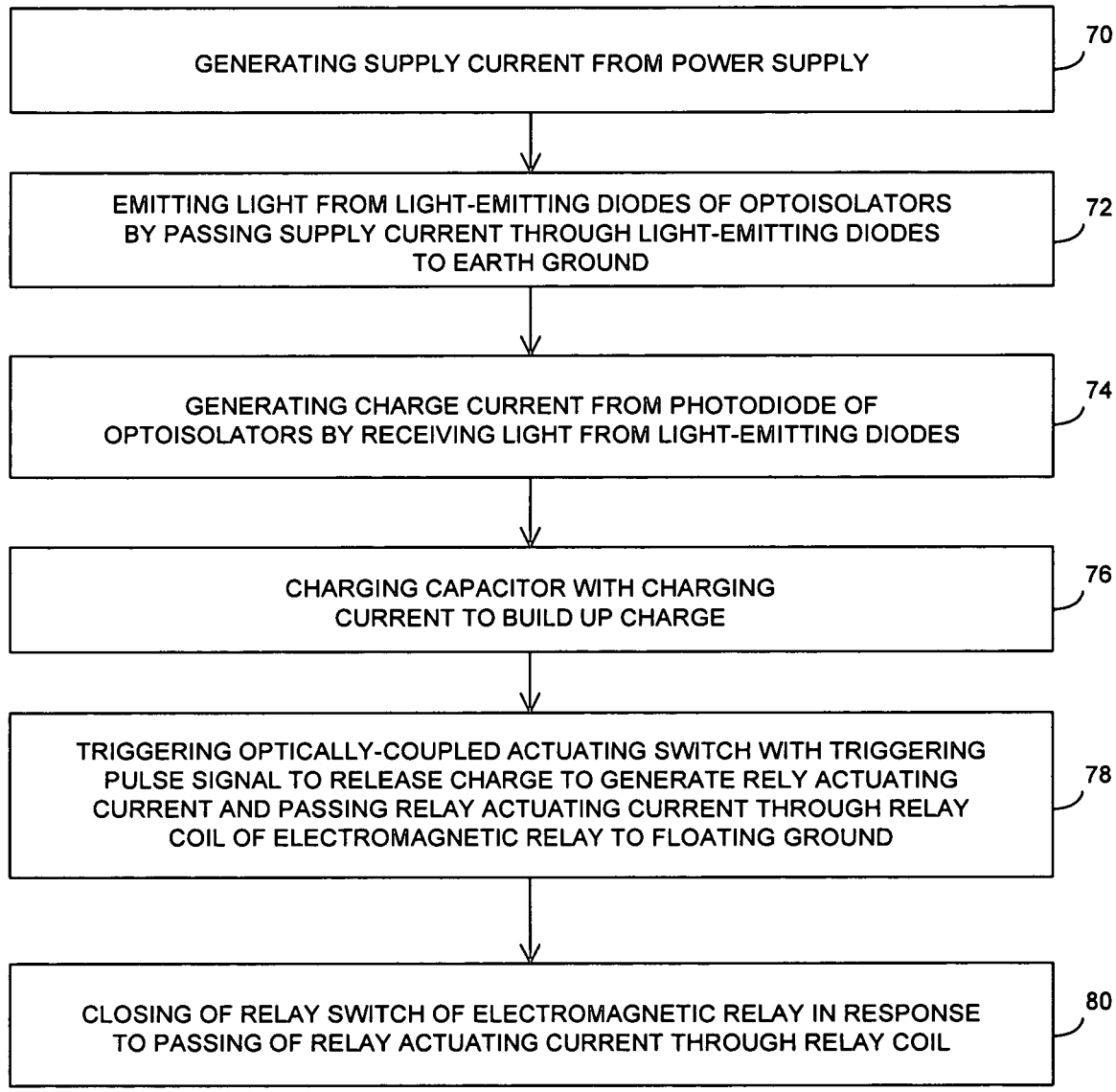
FIG. 4 is a flow chart of the operation of the relay actuator circuit and electromagnetic relay of FIG. 1, according to some embodiments of the present invention.

In an operation 74 of FIG. 4, in response to received light energy generated by the LEDs 16, the photodiodes 18 may generate a charging current. In one embodiment, with the LEDs 16 operating with a supply current of at about 20-30 mA each, the twelve photodiodes 18 may produce an output of 6V, with each photodiode 18 producing about 500 mv and driving a current of initially about 140 uA. The optoisolators 14 may operated in a "power supply" or "solar cell" mode to achieve this charging current, as will be described hereinafter with respect to FIG. 5. In an operation 76 of FIG. 4, the charging current output of the optoisolators 14 may charge the capacitor 32 with a charge. In one embodiment, the capacitor 32 may need about 2 seconds to charge to 6V.

In an operation 78 of FIG. 4, the charge of the capacitor 32 may be released with the actuating switch 30 so as to generate the relay actuating current. More specifically, the low-voltage trigger pulse source 58 may provide a pulse signal to trigger the actuating switch 30, thus actuating the relay 12 with a relay actuating current generated by the capacitor 32 dumping its charge into the relay coil 38 to the floating ground 27. The capacitor 32 may to store enough charge to drive the relay coil 38 for a sufficiently long enough period of time (e.g., milliseconds). In an operation 80 of FIG. 4, the relay switch 44 of the electromagnetic relay 12 may be closed in response to the passing of the relay actuating current through the relay coil 38. In one embodiment, the actuating switch 30 desirably may drop 1V or less so that a voltage of 5V and a relay actuating current of 50 mA may be sustained across the relay coil 38 for a few milliseconds, long enough to close the relay switch 44 (contacts 50 and 52 come into contact). The relay switch 44 may be characterized as being magnetically coupled to the relay coil 38 so that the relay actuating current passing through the relay coil 38 generates a magnetic field that causes the relay switch 44 to change states, e.g., transition from an open state to a close state.

Figure 5:
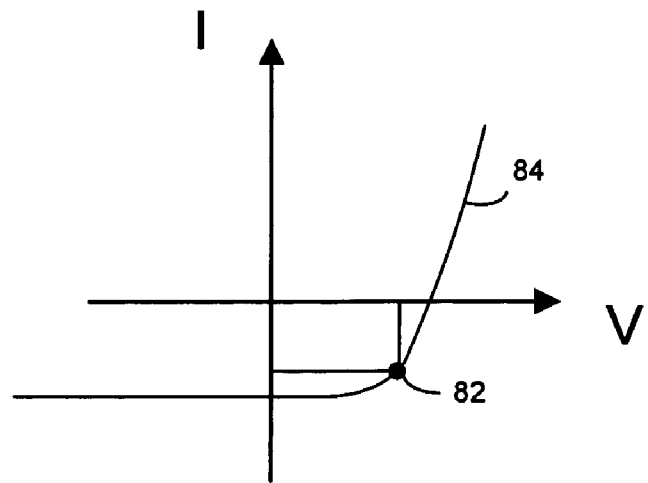
FIG. 5 is a chart of voltage versus current for photodiodes shown in FIG. 1, according to various embodiments.

Referring to FIG. 5, there is illustrated a current versus voltage (I-V) chart for the photodiodes 18 of FIG. 1, with four quadrants of an I-V plane, in accordance with various embodiments. In other applications, the photodiodes 18 in optoisolators 14 usually are used in the 3rd quadrant of the I-V plane, not in the (power-generating) 4th quadrant. The 4th quadrant is known as the "solar cell" mode of operation of a photodiode, but is not usually employed in optoisolators because of its low efficiency. However, the photodiodes 18, when operating in the solar cell mode, may allow for pulsed actuation of the relay 12. An illustrative operating point 82 on a graph 84 of current versus voltage chart is shown in the 4th quadrant for the photodiodes 18 of FIG. 1. The silicon photodiodes 18 may put out about +500 mV at such a current when operating in the solar cell mode, even though the photodiodes 18 are usually used in the negative voltage bias regime. This allows the relay actuator circuit 10 of FIG. 1 to be constructed and used as a 6V supply for the capacitor 32.

Referring to FIG. 1, in some embodiments, the closing of the relay switch 44 from an open state to a closed state may allow, for example, a high-voltage pulse from the high-voltage source 46 to pass through the relay switch 44 and through the load resistance R2 to the earth ground 24. In some embodiments, the voltage source 46, when used with the relay 12, may be a high-voltage pulser. In these embodiments, the relay actuator circuit 10 may allow for the needed charge to be accumulated by the capacitor 32 over a period of several seconds to generate a relay actuating pulse (relay actuating current) having a duration of several milliseconds. This relay actuating pulse may be used for pulsed relay operation. For example, the capacitor 32 may fill with about 250 uC of charge in a reasonably short period of time. A temporary pulsed activation of the relay 12 across a high-voltage interface by the actuator switch 30 results in a charge burst from the capacitor 32.

In one tested design of the relay actuator circuit 10, the capacitor 32 charged to 5.48V in 1.8 seconds with a current of 30 mA in the string of LEDs 16 and then gradually charged to a final 6.46V as the current tapered off. A 5 msec low-voltage pulse coupled through the optically-isolated actuating switch 30 triggered the relay 12. The relay 12 stayed on for approximately 3.6 msec, and did not bounce, as the voltage of the capacitor 32 declined.

When the high-voltage source 46 may be used as a high-voltage pulser, it may be desirable for the relay 12 to switch as much voltage as possible. As previously described, the relay 12 may operate to higher voltage if the relay coil 38 is allowed to float, and if the actuating signal to the relay coil 38 is not referred to earth ground. As one example of the previously-described increase in breakdown voltage of the relay 12 (Aleph ZH1A05NZ), the relay coil 38 was activated by 5V and 50 mA (i.e. 100 ohms) for a few milliseconds, and the operating limit for the relay 12 went from about 800V to over 1500V by floating the relay coil 38. In this way, the voltage limit became determined by breakdown across the relay contacts 50 and 52.

There are many other applications for the relay actuator circuit 10 and the pulser application was just one example. For example, in some embodiments, the relay 12 may be a latching mechanical relay, which has SET and RESET inputs to change the switch position, each of which is operated with a pulse. The relay coil 38 may actuate a latching relay switch 44 that would stay closed until a reset pulse. In this application, the 2-second latency may be needed for operation of such relay 12 across a high-voltage barrier (interface) with optical coupling and optical power of the relay actuator circuit 10.

In some embodiments, there may be further application-specific modifications of the low-voltage circuitry; for example, since only a few seconds are needed to charge the capacitor, the low-voltage power supply 26 may be gated on and the optically-coupled pulse to the actuating switch 30 delivered in a timed sequence using a timer circuit, such as a National Semiconductor LM555 timer circuits. This may save energy expended in the series coupled LEDs 14 and may make it more feasible to use a battery for the power supply 26.

As previously described, the relay actuator circuit 10 may not only provide for optical isolation of a relay-actuating signal, it may also have an optically-powered supply of energy for the relay actuation. In some embodiments, these features of the relay actuator circuit 10 may be combined in one compact assembly of optoisolator components. The relay actuator circuit 10 may be a lightweight, compact solution to coupling of relay coil actuation across a high-voltage barrier. The circuitry may be solid state and may weigh substantially less and may occupy less volume than a full power supply or a transformer needed to couple (for example) 50 mA at 5V for several milliseconds.

Although the relay actuator circuit 10 has been described as taking advantage of the most convenient off-the-shelf optocoupler technology, it may also be possible to implement the relay actuator circuit 10 in a more compact implementation with standard packaging methods. More specifically, the relay actuator circuit 10 of FIG. 1 may be captured in a single package for an even more compact, lightweight module, except perhaps aside from the capacitor 32 on the high-voltage side.

Figure 6:
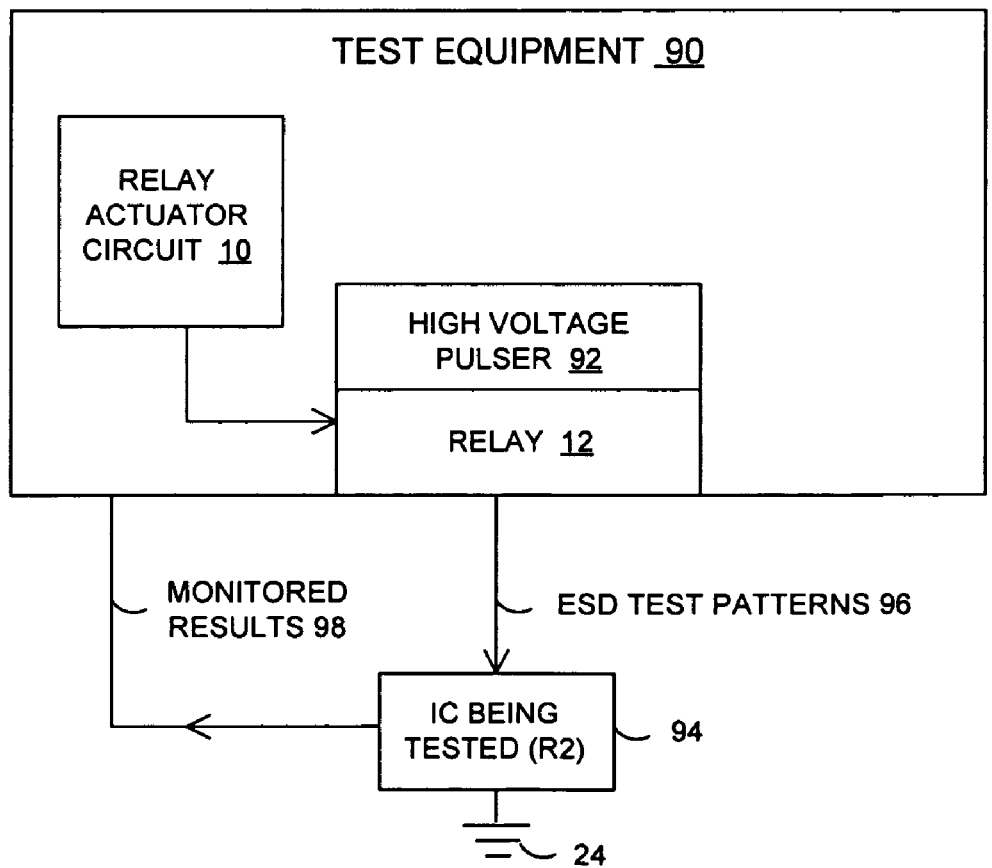
FIG. 6 is a block diagram of a system, according to some embodiments of the present invention.

Referring to FIG. 6, there is illustrated test equipment system 90, according to some embodiments of the present invention, incorporating the relay actuator circuit 10 and the electromagnetic relay 12. A high-voltage pulser 92 may be coupled through the relay 12 (when in its close state) to an integrated circuit (IC) 94. The high-voltage pulser 92 is one specific example of the high-voltage source 46 of FIG. 1. In this example embodiment, the high-voltage pulser 92 may be used for electrostatic discharge (ESD) testing by applying ESD test patterns 96 to the IC 94 when the relay 12 is closed by the actuator circuit 10. In this manner, the IC 94 has the load resistance R2 shown in FIG. 1, with the relay 12 being coupled to the earth ground 24 through the resistance R2. Monitored results 98 of the ESD testing may be provided from the IC 94 to the test equipment 90 for evaluation. The high-voltage pulser 92 may take a number of different forms. For example, in some embodiments, the high-voltage pulser 92 may be a charged transmission line, which produces the ESD test patterns 96. The monitored results 98 may be the response of the stressed IC 94 to the ESD test patterns 96. With some testing procedures, when the monitored results 98 indicate an electrostatic discharge failure has occurred in the IC 94, a failure analysis procedure may be followed which may identify and solve the failure.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
a power supply to generate a supply current;
at least one optoisolator coupled to the power supply and responsive to the supply current to generate a charging current, and including a light-emitting diode coupled between the power supply and a low-voltage ground, and at least one photodiode optically coupled to the light-emitting diode;
a capacitor coupled to the at least one optoisolator and responsive to the charging current to build up a charge, wherein the at least one photodiode is coupled between the capacitor and a high-voltage ground, with a high voltage of the high-voltage ground being high relative to a low voltage of the low-voltage ground; and
an actuating switch, coupled to the capacitor, to release the charge from the capacitor to generate a relay actuating current;
wherein the power supply and the light-emitting diode define a low-voltage circuit portion and the at least one photodiode, the actuating switch and the capacitor define a high-voltage circuit portion, with a high voltage of the high-voltage circuit portion being high relative to a low voltage of the low-voltage circuit portion.

2. The apparatus according to claim 1, wherein the capacitor is coupled in parallel with the at least one photodiode.

3. The apparatus according to claim 1, wherein the at least one optoisolator includes a plurality of optoisolators, with the light-emitting diodes of the plurality of optoisolators being coupled in series and the photodiodes of the plurality of optoisolators being coupled in series.

4. The apparatus according to claim 3, wherein the series-coupled light-emitting diodes of the plurality of optoisolators are coupled between the power supply and the low-voltage ground; the series-coupled photodiodes of the plurality of optoisolators are coupled between the actuator switch and the high-voltage ground; and the capacitor is coupled in parallel with the series-coupled photodiodes.

5. The apparatus according to claim 1, wherein the actuating switch is an optically-switched switch.

6. The apparatus according to claim 5, further comprising:
a trigger pulse source to generate a triggering pulse signal; the optically-switched switch being coupled between the trigger pulse source and the low-voltage ground and response to the triggering pulse signal to transition from an open state to a close state.

7. The apparatus of claim 1, further comprising:
an electromagnetic relay including a relay coil coupled to the actuating switch to receive the relay actuating current; and a relay switch magnetically coupled to the relay coil and responsive to the relay actuating current in the relay coil to transition from an open state to a close state.

8. The apparatus according to claim 7, wherein the relay coil is coupled between the actuating switch and the high-voltage ground and the power supply is coupled between the at least one optoisolator and the low-voltage ground.

9. The apparatus according to claim 8, wherein
the actuating switch is an optically-switched switch; and
the apparatus further comprises:
    a trigger pulse source to generate a triggering pulse signal; the optically-switched switch being coupled between the trigger pulse source and the low-voltage ground and responsive to the triggering pulse signal to transition from an open state to a close state; and
    a voltage source, with the relay switch being coupled between the voltage source and the low-voltage ground.

10. The apparatus according to claim 9, wherein the voltage source has a relatively high voltage compared to a relatively low power voltage of the power supply and a relatively low trigger voltage of the trigger pulse source.

11. The apparatus according to claim 9, wherein the voltage source is adapted to generate a pulsed voltage signal.

12. The apparatus according to claim 9, wherein the supply current is a direct current.

13. A method, comprising:
generating a supply current from a power supply;
coupling a light-emitting diode of at least one optoisolator between the power supply and a low-voltage ground;
coupling at least one photodiode of the at least one optoisolator between a capacitor and a high-voltage ground, with a high voltage of the high-voltage ground being high relative to a low voltage of the low-voltage ground, and wherein the power supply and the light-emitting diode define a low-voltage circuit portion and the at least one photodiode, the actuating switch and the capacitor define a high-voltage circuit portion, with a high voltage of the high-voltage circuit portion being high relative to a low voltage of the low-voltage circuit portion;
emitting light from a light-emitting diode of the at least one optoisolator by passing the supply current through the light-emitting diode;
generating a charge current from the at least one photodiode by receiving the light from the light-emitting diode;
charging the capacitor with the charging current to build up a charge;
releasing the charge with an actuating switch so as to generate a relay actuating current; and
passing the relay actuating current through a relay coil of an electromagnetic relay to the high-voltage ground.

14. The method according to claim 13, wherein the actuating switch is an optically-switched switch, and the method further comprises:
triggering the actuating switch with a triggering pulse signal.

15. The method according to claim 13, wherein the emitting of light from the light-emitting diode of the at least one optoisolator by passing the supply current through the light-emitting diode further includes passing the supply current through the light-emitting diode to the low-voltage ground.

16. The method according to claim 15, further comprising:
closing of a relay switch of the electromagnetic relay in response to the passing of the relay actuating current through the relay coil.

17. A system, comprising:
a relay actuator circuit including:
    a power supply to generate a supply current;
    at least one optoisolator coupled to the power supply and responsive to the supply current to generate a charging current, and including a light-emitting diode coupled between the power supply and a low-voltage ground, and at least one photodiode optically coupled to the light-emitting diode;
    a capacitor coupled to the at least one optoisolator and responsive to the charging current to build up a charge, wherein the at least one photodiode is coupled between the capacitor and a high-voltage ground, with a hi voltage of the high-voltage ground being high relative to a low voltage of the low-voltage ground;
    an actuating switch, coupled to the capacitor, to release the charge from the capacitor to generate a relay actuating current; and
    wherein the power supply and the light-emitting diode define a low-voltage circuit portion and the at least one photodiode, the actuating switch and the capacitor define a high-voltage circuit portion, with a high voltage of the high-voltage circuit portion being high relative to a low voltage of the low-voltage circuit portion;
an electromagnetic relay including a relay coil coupled to the actuating switch to receive the relay actuating current; and a relay switch magnetically coupled to the relay coil and responsive to the relay actuating current in the relay coil to transition from an open state to a close state: and
a high-voltage pulser coupled to a terminal of the relay switch, and adapted to output electrostatic discharge test patterns.

18. The system according to claim 17, wherein the relay switch further comprises another terminal to receive an integrated circuit and to apply the electrostatic discharge test patterns outputted by the high-voltage pulser to the integrated circuit.

19. The system according to claim 17, wherein the actuating switch is an optically-switched switch and the system further comprises:
a trigger pulse source to generate a triggering pulse signal; the optically-switched switch being coupled between the trigger pulse source and the low-voltage ground and responsive to the triggering pulse signal to transition from an open state to a close state.

20. The system according to claim 19, wherein the high-voltage pulser has a relatively high voltage compared to a relatively low power voltage of the power supply and a relatively low trigger voltage of the trigger pulse source.

* * * * *

UNITED STATES PATENT AND TRADEMARK OFFICE
CERTIFICATE OF CORRECTION

PATENT NO. : 7,817,400 B2
APPLICATION NO. : 11/415802
DATED : October 19, 2010
INVENTOR(S) : Timothy J. Maloney Page 1 of 1

It is certified that error appears in the above-identified patent and that said Letters Patent is hereby corrected as shown below:

In claim 6, col. 7, lines 5-6, "... from an open state to a close state." should read – "... from an open state to a closed state."

In claim 7, col. 7, lines 12-13, "... from an open state to a close state." should read – "... from an open state to a closed state."

In claim 9, col. 7, line 25, "... from an open state to a close state; ..." should read – "... from an open state to a closed state; ..."

In claim 17, col. 8, lines 24-25, "..., with a hi voltage ..." should read – "..., with a high voltage ..."

In claim 17, col. 8, lines 42-43, "... from an open state to a close state: ..." should read – "... from an open state to a closed state: ..."

In claim 17, col. 8, line 43, "... state: and ..." should read – "... state; and ..."

In claim 19, col. 8, line 59, "... from an open state to a close state." should read – "... from an open state to a closed state."

Signed and Sealed this
Twelfth Day of February, 2013

Teresa Stanek Rea
*Acting Director of the United States Patent and Trademark Office*